US007729397B1

(12) United States Patent
Gollier et al.

(10) Patent No.: US 7,729,397 B1
(45) Date of Patent: Jun. 1, 2010

(54) MULTI-VARIABLE CONTROL METHODS FOR OPTICAL PACKAGES

(75) Inventors: Jacques Gollier, Painted Post, NY (US); Garrett Andrew Piech, Horseheads, NY (US); Dragan Pikula, Horseheads, NY (US); Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 41 days.

(21) Appl. No.: 12/335,692

(22) Filed: Dec. 16, 2008

(51) Int. Cl.
*H01S 3/13* (2006.01)
(52) U.S. Cl. .............................. 372/29.021; 372/20.02; 372/22; 372/21; 372/34
(58) Field of Classification Search ............ 372/29.021, 372/20.02, 22, 21, 34
See application file for complete search history.

(56) References Cited

U.S. PATENT DOCUMENTS 7,505,492 B2 * 3/2009 Gollier et al. .......... 372/29.011

7,542,492 B2 * 6/2009 Bhatia ................... 372/29.014

OTHER PUBLICATIONS

"Resonant Drive: Sense and High Voltage Electrostatic Drive Using Single Mems Capacitor and Low Voltage Electronics"; Cagdaser et al; 2005 IEEE, p. 142-146.

* cited by examiner

*Primary Examiner*—Minsun Harvey
*Assistant Examiner*—Kinam Park
(74) *Attorney, Agent, or Firm*—Svetlana Z. Short

(57) ABSTRACT

According to one embodiment of the present invention, an optical package comprises one or more semiconductor lasers coupled to a wavelength conversion device with adaptive optics. The optical package also comprises a package controller programmed to operate the semiconductor laser and the adaptive optics based on modulated feedback control signals supplied to the wavelength selective section of the semiconductor laser and the adaptive optics. The wavelength control signal supplied to the wavelength selective section of the semiconductor laser may be adjusted based on the modulated wavelength feedback control signal such that the response parameter of the wavelength conversion device is optimized. Similarly, the position control signals supplied to the adaptive optics may be adjusted based on the modulated feedback position control signals such that the response parameter of the wavelength conversion device is optimized.

20 Claims, 4 Drawing Sheets

MULTI-VARIABLE CONTROL METHODS FOR OPTICAL PACKAGES

BACKGROUND OF THE INVENTION

1. Field of the Invention

The present invention generally relates to semiconductor lasers, laser controllers, optical packages, and other optical systems incorporating semiconductor lasers. More specifically, the present invention relates to methods for optimizing the output of optical packages that include, inter alia, a semiconductor laser optically coupled to a second harmonic generation (SHG) crystal, or another type of wavelength conversion device, with adaptive optics.

2. Technical Background

Short wavelength light sources can be formed by combining a single-wavelength semiconductor laser, such as an infrared or near-infrared distributed feedback (DFB) laser, distributed Bragg reflector (DBR) laser, or Fabry-Perot laser, with a light wavelength conversion device, such as a second harmonic generation (SHG) crystal. Typically, the SHG crystal is used to generate higher harmonic waves of the fundamental laser signal. To do so, the lasing wavelength is preferably tuned to the spectral center of the wavelength converting SHG crystal and the output of the laser is preferably aligned with the waveguide portion at the input facet of the wavelength converting crystal.

Waveguide optical mode field diameters of typical SHG crystals, such as MgO-doped periodically poled lithium niobate (PPLN) crystals, can be in the range of a few microns. As a result, properly aligning the beam from the semiconductor laser with the waveguide of the SHG crystal such that the output of the SHG crystal is optimized may be a difficult task. More specifically, optimizing the output of the SHG crystal requires that the position of the beam of the semiconductor laser be precisely controlled along two axes on the input face of the SHG crystal. Accordingly, at least two variables must be monitored and controlled to position the beam of the semiconductor laser such that the output of the laser is maximized.

Similarly, the phase matching bandwidth of SHG crystals are typically narrow, generally less than 1 nm. For example, for a 12 mm long PPLN crystal, the phase matching bandwidth may be about 0.16 nm. As such, the wavelength of the semiconductor laser must be precisely controlled to optimize the second harmonic output of the SHG crystal. This may be accomplished by the application of heat to the wavelength control section of the semiconductor laser or by injecting current into the wavelength control section of the semiconductor laser.

Accordingly, to maximize the output efficiency of the wavelength conversion device, at least three variables must be controlled. Therefore, multi-variable control techniques for optical packages comprising a semiconductor laser optically coupled to a wavelength conversion device, such as a second harmonic generation (SHG) crystal, are needed.

SUMMARY OF THE INVENTION

One aspect of the present invention includes a multi-variable control method for controlling an optical package in which a single output of the optical package is monitored to determine how to adjust multiple control variables. Specifically, the multi-variable control method uses multiple phase, frequency and/or time shifted modulation signals to optimize the output of the optical package. The optical package may include a semiconductor laser, a wavelength conversion device, adaptive optics configured to optically couple an output beam of the semiconductor laser into a waveguide portion of an input facet of a wavelength conversion device, an optical detector, and a package controller programmed to operate the semiconductor laser and at least one adjustable optical component of the adaptive optics.

According to one embodiment shown and described herein, the method of controlling the optical package may include controlling the periodic lasing intensity of the semiconductor laser by controlling an amount of gain current $I_{GAIN}$ injected into a gain section of the semiconductor laser. The periodic frequency $v_{DATA}$ of the gain current $I_{GAIN}$ may represent an encoded data signal which contains data for generating an image in a laser projection system. A wavelength control signal may be supplied to a wavelength selective section of the semiconductor laser to control the lasing wavelength of the semiconductor laser. The output beam of the semiconductor laser may be positioned on the input facet of the wavelength conversion device by supplying a position control signal to the adjustable optical component which, in turn, varies the position of the adjustable optical component. A modulated wavelength feedback control signal may be supplied to the wavelength selective section to modulate the lasing wavelength $\lambda_1$ of the semiconductor laser. The modulated wavelength feedback control signal may have a frequency $v_\lambda$ such that:

$$v_\lambda = (N+1/P)v_{DATA}$$

where, N is an integer and P is an integer greater than one. In addition, a modulated position feedback control signal may be supplied to the adjustable optical component to modulate the position of the output beam on the input facet of the wavelength conversion device. The modulated position feedback control signal may be out of phase with the modulated wavelength feedback control signal while the frequency $v_\theta$ of the modulated position feedback control signal may be the same as the frequency $v_\lambda$ of the modulated wavelength feedback control signal. The response parameter of the wavelength conversion device may be measured with the optical detector as the modulated signals are supplied to the adjustable optical component and the semiconductor lasers. Thereafter, the measured response parameter of the wavelength conversion device may be analyzed to identify spectral and positional components attributable to the modulated wavelength feedback control signal and modulated position control signal. After the measured response parameter is analyzed, the wavelength control signal and the position control signal may be adjusted based on the spectral and positional components of the measured response parameter, respectively, to optimize the response parameter of the wavelength conversion device.

In another embodiment shown and described herein, the method of controlling the optical package may include controlling the periodic lasing intensity of the semiconductor laser by controlling an amount of gain current $I_{GAIN}$ injected into a gain section of the semiconductor laser, wherein a periodic frequency $v_{DATA}$ of the gain current $I_{GAIN}$ represents an encoded data signal. A first position control signal may be supplied to the adjustable optical component to control the position of the output beam on the input facet of the wavelength conversion device in a first direction. In addition, a second position control signal may be supplied to the adjustable optical component to control the position of the output beam on the input facet of the wavelength conversion device in a second direction. A first modulated position feedback control signal may be supplied to the adjustable optical component to modulate the position of the output beam on the input facet of the wavelength conversion device in the first direction. The first modulated position feedback control signal may have a frequency $v_{\theta 1}$ such that:

$$v_{\theta 1}=(N+1/P)v_{DATA}$$

where N is an integer and P is an integer greater than 1. A second modulated position feedback control signal is supplied to the adjustable optical component to modulate the position of the output beam on the input facet of the wavelength conversion device in the second direction. The second modulated position feedback control signal may be out of phase with the first modulated position feedback control signal. The frequency $v_{\theta 1}$ of the modulated position feedback control signal may be the same as the frequency $v_{\theta 1}$ of the second modulated position feedback control signal. The response parameter of the wavelength conversion device may be measured with the optical detector. Thereafter, the measured response parameter of the wavelength conversion device is analyzed to identify positional components attributable to the first modulated position feedback control signal and the second modulated position feedback control signal. The first position control signal and the second position control signal are then adjusted based on the positional component attributable to the first modulated position feedback control signal and the second modulated position feedback control signal, respectively, to optimize the response parameter of the wavelength conversion device.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE PREFERRED EMBODIMENTS

Figure 1:
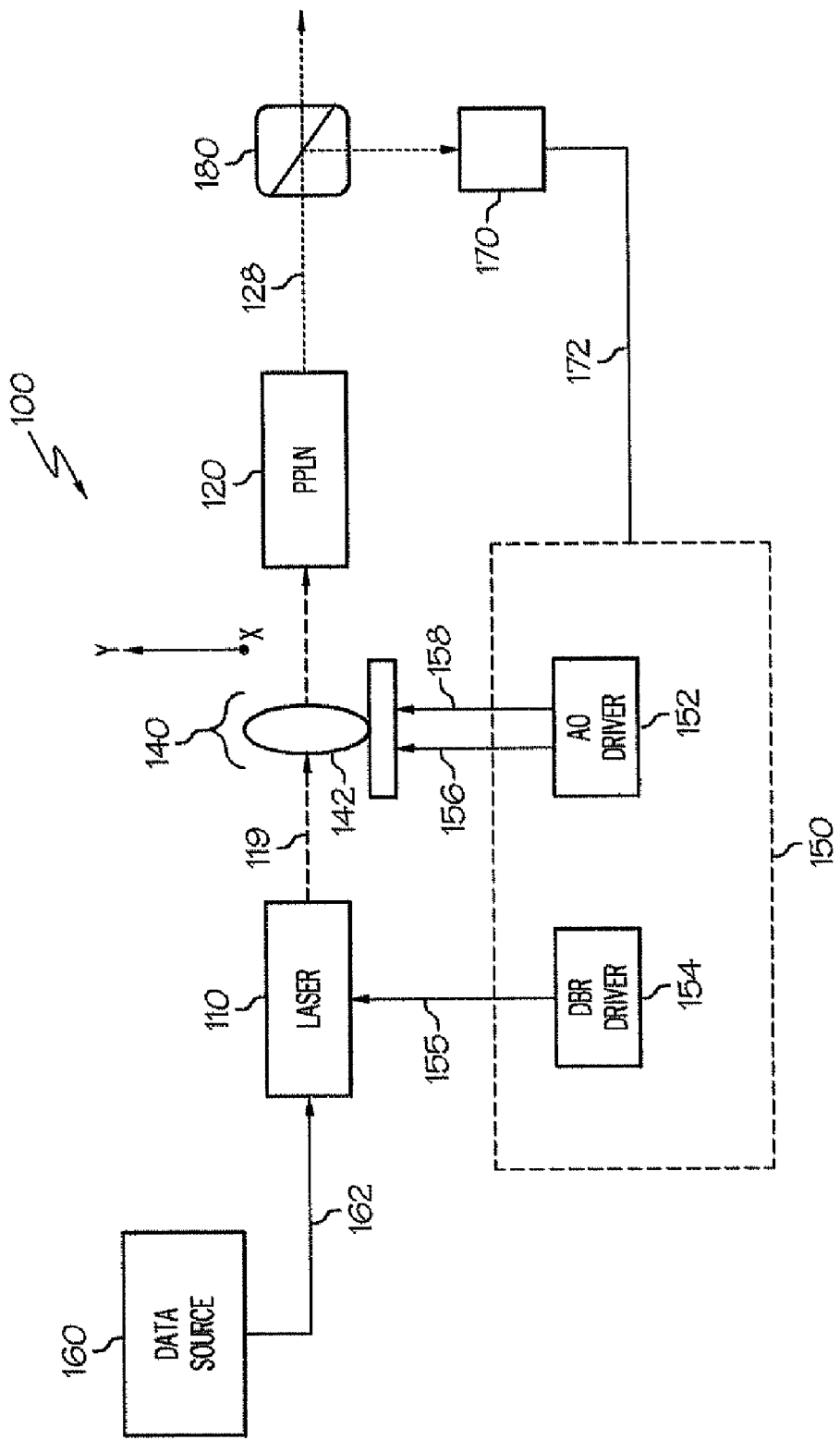
FIG. 1 is a schematic diagram of one embodiment of an optical package shown and described herein.

Reference will now be made in detail to embodiments of the invention, examples of which are illustrated in the accompanying drawing. Whenever possible, the same reference numerals will be used throughout the drawings to refer to the same or like parts. One embodiment of an optical package for use in conjunction with the control methods described herein is shown in FIG. 1. The optical package generally comprises a semiconductor laser, adaptive optics, a wavelength conversion device and a package controller. The output of the semiconductor laser is optically coupled into the input facet of the wavelength conversion device with the adaptive optics. The package controller is electrically coupled to the semiconductor laser and the adaptive optics and configured to control the output of the semiconductor laser and the alignment of the semiconductor laser with the wavelength conversions device. Various components and configurations of the optical package and multivariable control methods for optimizing the output of the optical package will be further described herein.

Figure 2:
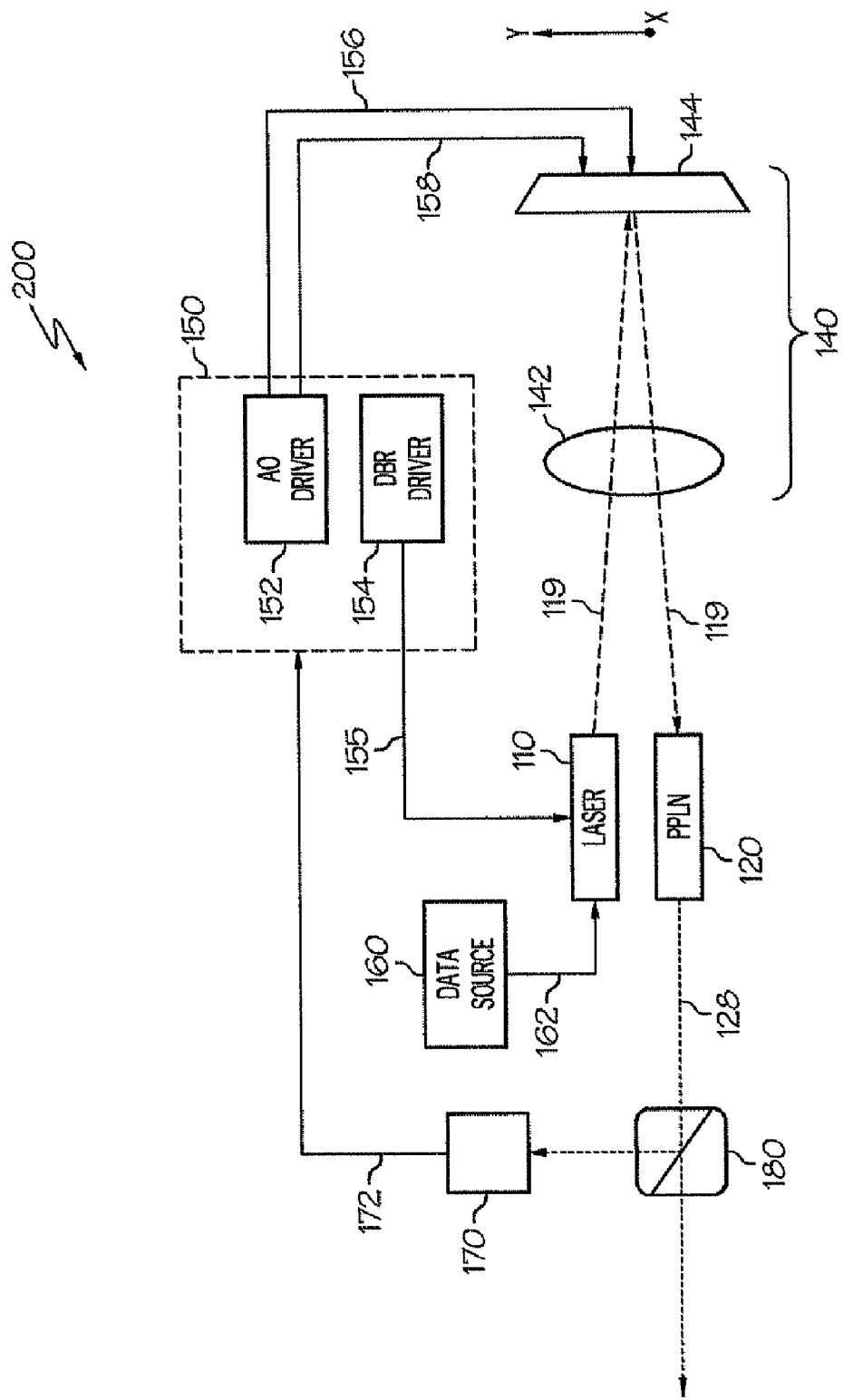
FIG. 2 is a schematic diagram of one embodiment of an optical package shown and described herein.

FIGS. 1 and 2 generally depict two embodiments of optical packages 100, 200 described herein. It should be understood that the solid lines and arrows indicate the electrical interconnectivity of various components of the optical packages. These solid lines and arrows are also indicative of electrical signals propagated between the various components including, without limitation, electronic control signals, data signals and the like. Further, it should also be understood that the dashed lines and arrows indicate infrared light beams and visible light beams emitted by the semiconductor laser and the wavelength conversion device, respectively.

Referring initially to FIGS. 1 and 2, although the general structure of the various types of optical packages in which the concepts of particular embodiments of the present invention can be incorporated are taught in readily available technical literature relating to the design and fabrication of frequency or wavelength-converted semiconductor laser sources, the concepts of particular embodiments of the present invention may be conveniently illustrated with general reference to the optical packages 100, 200 which include, for example, a semiconductor laser 110 optically coupled to a wavelength conversion device 120. The infrared light beam 119 emitted by the semiconductor laser 110 may be either directly coupled into the waveguide portion of the wavelength conversion device 120 or can be coupled into the waveguide portion of wavelength conversion device 120 using adaptive optics 140. The wavelength conversion device 120 converts the infrared light beam 119 into higher harmonic waves and outputs a visible light beam 128. This type of optical package is particularly useful in generating shorter wavelength laser beams from longer wavelength semiconductor lasers and can be used, for example, as a visible laser source for laser projection systems.

Figure 3:
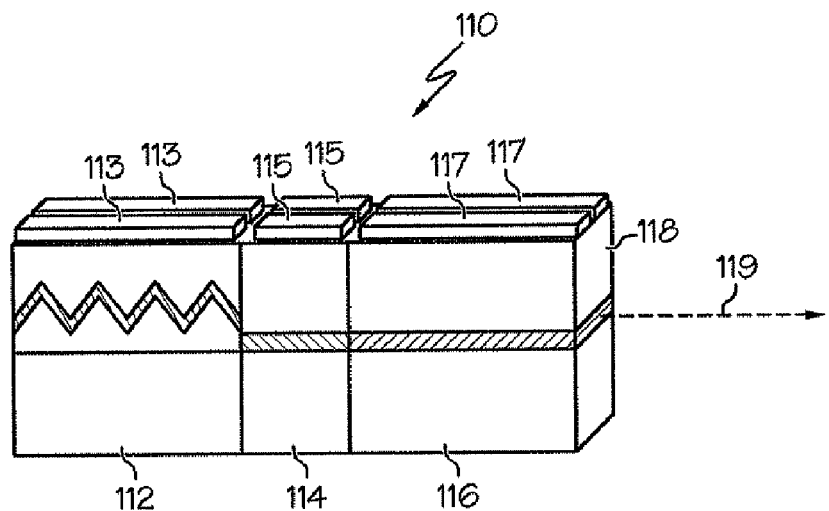
FIG. 3 depicts a semiconductor laser for use in conjunction with one or more embodiments of the optical packages shown and described herein.

The semiconductor laser 110, which is schematically illustrated in FIG. 3, may generally comprise a wavelength selective section 112, a phase matching section 114, and a gain section 116. The wavelength selective section 112, which may also be referred to as the distributed Bragg reflector or DBR section of the semiconductor laser 110, typically comprises a first order or second order Bragg grating positioned outside the active region of the laser cavity. This section provides wavelength selection, as the grating acts as a mirror whose reflection coefficient depends on the wavelength. The gain section 116 of the semiconductor laser 110 provides the major optical gain of the laser and the phase matching section 114 creates an adjustable optical path length or phase shift between the gain material of the gain section 116 and the reflective material of the wavelength selective section 112. The wavelength selective section 112 may be provided in a number of suitable alternative configurations that may or may not employ a Bragg grating.

Respective control electrodes 113, 115, 117 are incorporated in the wavelength selective section 112, the phase matching section 114, the gain section 116, or combinations thereof, and are merely illustrated schematically in FIG. 3. It is contemplated that the electrodes 113, 115, 117 may take a variety of forms. For example, the control electrodes 113, 115, 117 are illustrated in FIG. 3 as respective electrode pairs but it is contemplated that single electrode elements in one or more of the sections 112, 114, 116 will also be suitable for practicing particular embodiments of the present invention. The control electrodes 113, 115, 117 can be used to inject electrical current into the corresponding sections 112, 114, 116 of the semiconductor laser 110. For example, in one embodiment, current injected in to the wavelength selective section 112 of the semiconductor laser 110 can be used to control the wavelength of the infrared light beam 119 emitted from the output facet 118 of the semiconductor laser 110 by altering the operating properties of the laser. The injected current may be used to control the temperature of the wavelength selective section 112 or the index of refraction of the wavelength selective section. Accordingly, by adjusting the amount of current injected into the wavelength selective section, the wavelength of the infrared light beam 119 emitted by the semiconductor laser may be varied. Current injected into the phase matching section 114 or gain section 116 may be similarly used to control the output of the semiconductor laser 110.

Figure 4:
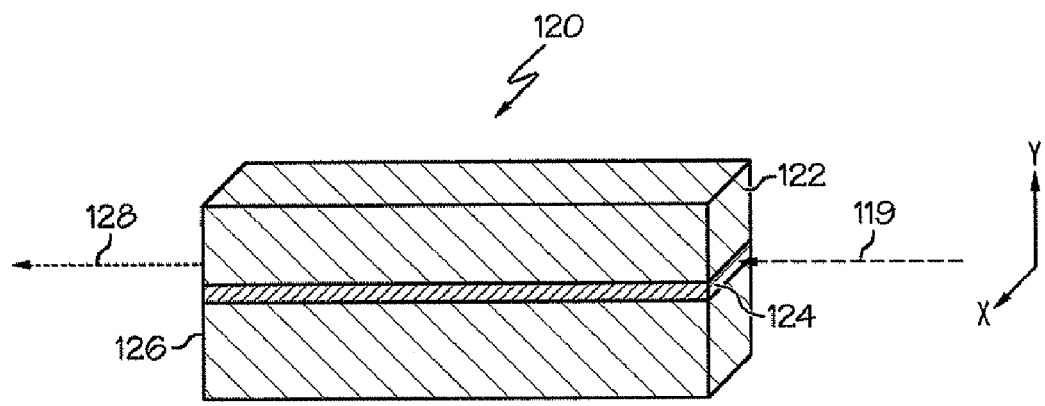
FIG. 4 depicts a wavelength conversion device for use in conjunction with one or more embodiments of the optical packages shown and described herein.

The wavelength conversion device 120, which is schematically illustrated in FIG. 4, generally comprises a non-linear optical crystal, such as a second harmonic generation (SHG) crystal. In one embodiment, the wavelength conversion device 120 may comprise an MgO-doped, periodically polled lithium niobate (PPLN) crystal although other, similar non-linear optical crystals may be used. Further, it should be understood that the wavelength conversion device may be a second harmonic generation (SHG) crystal or a non-linear optical crystal capable of converting light to higher order harmonics.

The wavelength conversion device 120 generally comprises an input facet 122 and an output facet 126. A waveguide portion 124 of the wavelength conversion device 120 extends between the input facet 122 to the output facet 128. When the wavelength conversion device 120 is a PPLN crystal, the waveguide portion of the PPLN crystal may have dimensions (e.g., height and width) on the order of 5 microns. An infrared light beam 119 directed into the waveguide portion 124 of the wavelength conversion device 120 is propagated through the wavelength conversion device 120 where it is converted to a visible light beam 128 which is emitted from the output facet 126 of the wavelength conversion device. In one embodiment, the infrared light beam 119 produced by the semiconductor laser 110 and directed into the waveguide portion 124 of the wavelength conversion device 120 has a wavelength of about 1060 nm. In this embodiment, the wavelength conversion device 120 converts the infrared light beam 119 to green light such that the visible light beam 128 has a wavelength of about 530 nm.

Referring now to FIG. 1, one embodiment of an optical package 100 is depicted in which the semiconductor laser 110 and the wavelength conversion device 120 have a substantially linear configuration. More specifically, the output of the semiconductor laser 110 and the input of the wavelength conversion device 120 are substantially aligned along a single optical axis. As shown in FIG. 1, the near infrared light 119 emitted by the semiconductor laser 110 is coupled into a waveguide portion of the wavelength conversion device 120 with adaptive optics 140.

In the embodiment shown in FIG. 1, the adaptive optics 140 generally comprises an adjustable optical component, specifically a lens 142. The lens 142 collimates and focuses the near infrared light 119 emitted by the semiconductor laser 110 into the waveguide portion of the wavelength conversion device 120. However, it should be understood that other types of lenses, multiple lenses, or other optical elements may be used. The lens 142 may be coupled to an actuator (not shown) for adjusting the position of the lens 142 in the x- and y-directions such that the lens 142 is an adjustable optical component. Adjusting the position of the lens in the x- and y-directions may facilitate positioning the infrared light beam 119 along the input face of the wavelength conversion device 120 and, more specifically, on the waveguide portion of the wavelength conversion device, such that the infrared light beam 119 is aligned with the waveguide portion and the output of the wavelength conversion device 120 is optimized.

Referring now to FIG. 2, another embodiment of an optical package 200 is shown in which the semiconductor laser 110, the wavelength conversion device 120 and the adaptive optics 140 are oriented in a folded configuration. More specifically, the output of the semiconductor laser 110 and the input of the wavelength conversion device 120 are positioned on substantially parallel optical axes. As with the embodiment shown in FIG. 1, the infrared light beam 119 emitted by the semiconductor laser 110 is coupled into the waveguide portion of the wavelength conversion device 120 with adaptive optics 140. However, in this embodiment, the infrared light beam 119 must be redirected from its initial pathway in order to order to facilitate coupling the infrared light beam 119 into the waveguide portion of the wavelength conversion device 120. Accordingly, in this embodiment, the adaptive optics 140 may comprise an adjustable optical component, specifically an adjustable mirror 144, and a lens 142.

As described hereinabove, the lens 142 of the adaptive optics 140 may collimate and focus the infrared light beam 119 emitted by the semiconductor laser 110 into the waveguide portion of the wavelength conversion device 120.

The adjustable mirror 144 may be rotated about an axis of rotation substantially parallel to the x-axis depicted in FIG. 2 and about an axis of rotation substantially parallel to the y-axis to introduce angular deviation in the infrared light beam 119. The adjustable mirror 144 may comprise a mirror portion and an actuator portion and the adjustable mirror 144 may be rotated about either axis of rotation by adjusting the actuator portion of the adjustable optical component.

For example, in one embodiment, the adjustable mirror 144 may comprise one or more movable micro-opto-electromechanical systems (MOEMS) or micro-electro-mechanical system (MEMS) operatively coupled to a mirror. The MEMS or MOEMS devices may be configured and arranged to vary the position of the infrared light beam 119 on the input facet of the wavelength conversion device 120. Use of MEMS or MOEMS devices enables adjustment of the infrared light beam 119 to be done extremely rapidly over large ranges. For example, a MEMS mirror with a +/−1 degree mechanical deflection, when used in conjunction with a 3 mm focal length lens, may allow the beam spot to be angularly displaced +/− 100 μm on the input face of the wavelength conversion device 120. The adjustment of the beam spot may be done at frequencies on the order of 100 Hz to 10 kHz due to the fast response time of the MEMS or MOEMS device.

Alternatively or additionally, the adjustable optical component may comprise one or more liquid lens components configured for beam steering and/or beam focusing. Still further, it is contemplated that the adjustable optical component may comprise one or more mirrors and/or lenses mounted to micro-actuators. In one contemplated embodiment, the adjustable optical component may be a movable or adjustable lens, as described with respect to FIG. 1, used in conjunction with a fixed mirror to form a folded optical pathway between the semiconductor laser 110 and the wavelength conversion device 120.

In the optical package 200 illustrated in FIG. 2, the adjustable mirror 144 is a micro-opto-electromechanical mirror incorporated in a relatively compact, folded-path optical system. In the illustrated configuration, the adjustable mirror 144 is configured to fold the optical path such that the optical path initially passes through the lens 142 to reach the adjustable mirror 144 as a collimated or nearly collimated beam and subsequently returns through the same lens 142 to be focused on the wavelength conversion device 120. This type of optical configuration is particularly applicable to wavelength converted laser sources where the cross-sectional size of the laser beam generated by the semiconductor laser 110 is close to the size of the waveguide on the input face of the wavelength conversion device 120, in which case a magnification close to one would yield optimum coupling in focusing the beam spot on the input face of the wavelength conversion device 120. For the purposes of defining and describing this embodiment of the optical package 200, it is noted that reference herein to a "collimated or nearly collimated" beam is intended to cover any beam configuration where the degree of beam divergence or convergence is reduced, directing the beam towards a more collimated state.

Referring now to both FIGS. 1 and 2, the optical packages 100, 200 may also comprise a beam splitter 180 positioned proximate the output of the wavelength conversion device 120. The beam splitter 180 is used to redirect a portion of the visible light beam 128 emitted from the wavelength conversion device 120 into an optical detector 170 which is used to measure the intensity of the emitted visible light beam 128 and output an electrical signal proportional to the measured intensity.

The optical packages 100, 200 may also comprise a package controller 150. The package controller 150 may comprise one or more micro-controllers or programmable logic controllers used to store and execute a programmed instruction set for operating the optical package 100, 200. Alternatively, the micro-controllers or programmable logic controllers may directly execute an instruction set. The package controller 150 may be electrically coupled to the semiconductor laser 120, the adaptive optics 140 and the optical detector 170 and programmed to operate both the semiconductor laser 110 and the adaptive optics 140. More specifically, in one embodiment, the package controller 150 may comprise drivers 152, 154 for controlling the adaptive optics and the wavelength selective section of the semiconductor laser, respectively.

The adaptive optics driver 152 may be coupled to the adaptive optics 140 with leads 152, 158 and supplies the adaptive optics 140 with x- and y-position control signals through the leads 152, 158, respectively. The x- and y-position control signals facilitate positioning the adjustable optical component of the adaptive optics in the x- and y-directions which, in turn, facilitates positioning the infrared light beam 119 of the semiconductor laser 110 on the input facet of the wavelength conversion device 120. For example, when the adjustable optical component of the adaptive optics 140 is an adjustable lens 142, as shown in FIG. 1, the x- and y-position control signals may be used to position the lens 142 in the x- and y-directions. Alternatively, when the adjustable optical component of the adaptive optics 140 is an adjustable mirror 144, as shown in FIG. 2, the x- and y-position control signals may be used to rotate the adjustable mirror 144 about an axis of rotation parallel to the x-axis and about an axis of rotation parallel to the y-axis.

The wavelength selective section driver 154 may be coupled to the semiconductor laser 110 with lead 155. The wavelength selective section driver 154 may supply the wavelength selective section 112 of the semiconductor laser 110 with wavelength control signal(s) which facilitates adjusting the wavelength $\lambda_1$ of the infrared light beam 119 emitted from the output facet of the semiconductor laser 110.

Further, the output of the optical detector 170 may be electrically coupled to an input of the package controller 150 with lead 172 such that the output signal of the optical detector 170 is passed to the package controller 150.

Figure 5:
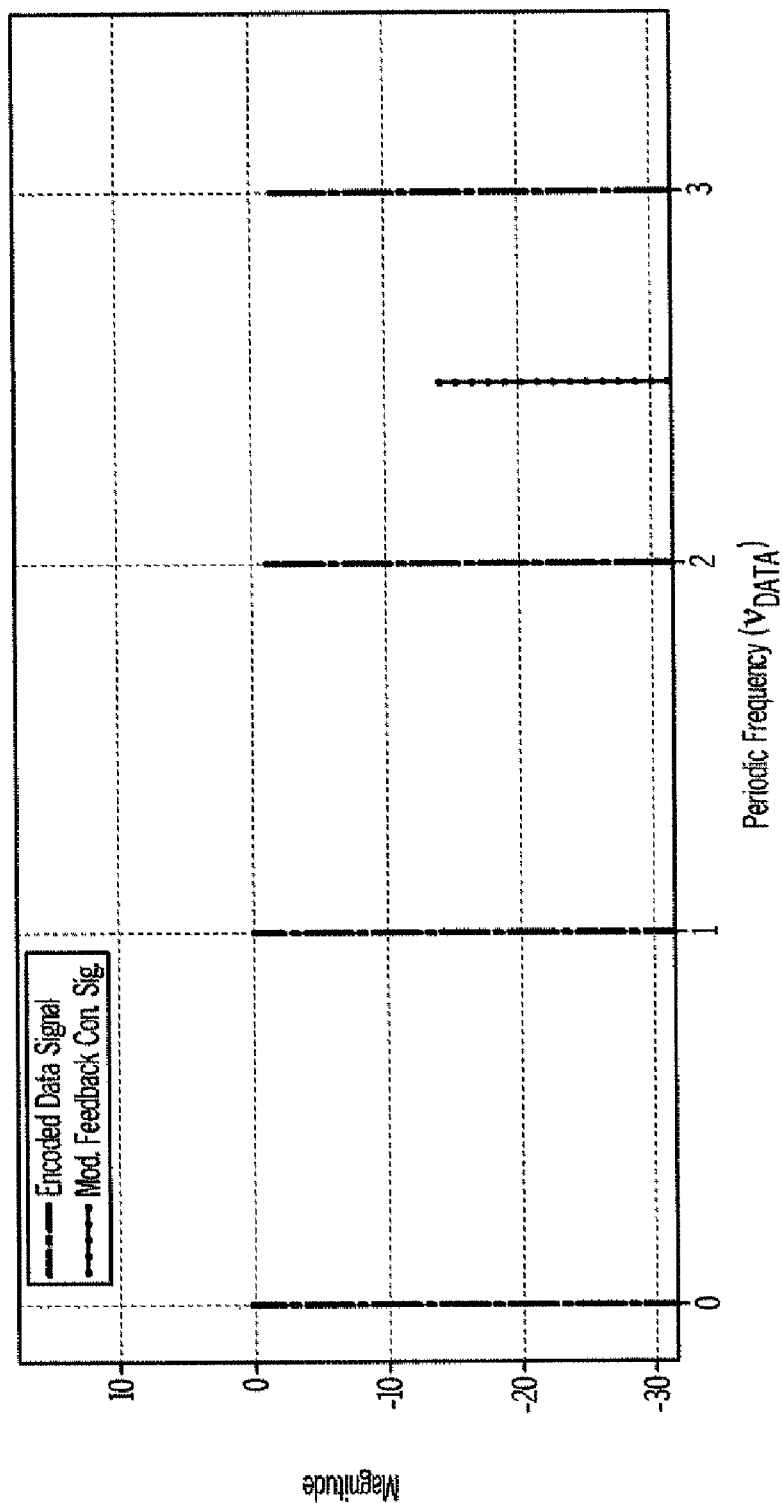
FIG. 5 is a simplified graphical illustration of the frequency content of an encoded data signal and a modulated control signal.

The optical package 100, 200 shown in FIGS. 1 and 2 may be coupled to a data source 160, such a programmable logic controller, which supplies the optical package 100, 200 with an encoded data signal which may be representative of a video image, still image or the like. More specifically, the data source 160 may be coupled to the gain section of the semiconductor laser 110 via lead 162. The data source 160 may control the periodic lasing intensity of the semiconductor laser 110 such that the output of the optical package 100, 200 forms an image when projected. To control the periodic lasing intensity of the semiconductor laser 110, the encoded data signal injects a gain current $I_{GAIN}$ into the gain section of the semiconductor laser 110. Typically, the periodic frequency $v_{DATA}$ of the gain current $I_{GAIN}$ is representative of the video image or still image of the encoded data signal such that, when the output of the optical package is projected, as modulated by the periodic frequency $v_{DATA}$ of the gain current $I_{GAIN}$, the projected image is the video image or still image of the encoded data signal. Typically, the periodic frequency $v_{DATA}$ of the encoded data signal is about 60 Hz which generally corresponds to the video frame rate of a projected image. FIG. 5 graphically illustrates the simplified frequency content of the encoded data signal for a still image. The x-axis of the graph is expressed in terms of the periodic frequency $v_{DATA}$ of the encoded data signal while the y-axis depicts the magnitude of the output of the optical package. The encoded data signal produces content at the periodic frequency $v_{DATA}$ of the encoded data signal and at harmonics of the periodic frequency $v_{DATA}$. As FIG. 5 is representative of a still image, the frequency content of the image is only DC content (e.g., the content at 0) and content at multiples of the periodic data frequency $v_{DATA}$ (e.g., $1*v_{DATA}$, $2*v_{DATA}$, etc.) However, in the case of a video image, additional low frequencies will be present in the signal in between DC and $1*v_{DATA}$, in between $1*v_{DATA}$ and $2*v_{DATA}$, etc.

Multi-variable control methods for optimizing the output of the optical packages 100, 200 will now be discussed with specific reference to the optical package 200 shown in FIG. 2. However, it should be understood that such control techniques are also applicable to the optical package 100 shown in FIG. 1 and generally applicable to optical packages have similar components and configurations.

The multi-variable control methods described herein utilize the package controller 150 to apply control signals to the semiconductor laser 110 and the adaptive optics 140 in order to optimize the output of the optical package 200. More specifically, the control signals applied to the semiconductor laser 110 and the adaptive optics 140 may be applied to the semiconductor laser 110 and adaptive optics 140 using a single modulation frequency, whose frequency is different than the periodic frequency $v_{DATA}$ of the encoded data signal supplied by the data source 160, and is also different from the frequency of the harmonics of the data signal, to avoid any interference with the encoded data signal.

In one embodiment, the periodic lasing intensity of the semiconductor laser is controlled by supplying the gain section of the semiconductor laser with a gain current $I_{GAIN}$ having a periodic frequency $v_{DATA}$, as described herein. The package controller 150 controls the lasing wavelength $\lambda_1$ of the semiconductor laser 110 by supplying a wavelength control signal to the wavelength selective section of the semiconductor laser 110. Similarly, the package controller 150 supplies the adaptive optics 140, specifically the adjustable optical component of the adaptive optics 140, with a position control signal to position the IR light beam 119 on the input facet of the wavelength conversion device 120.

In order to optimize the output of the optical package 200, specifically the properties of the visible light beam 128 emitted by the wavelength conversion device 120, the package controller 150 may be used to supply the wavelength selective section of the semiconductor laser 110 with a modulated or dithered wavelength feedback control signal to modulate or dither the lasing wavelength $\lambda_1$ of the semiconductor laser 110. As described hereinabove, to optimize the output of the wavelength conversion device, the wavelength of the IR light beam 119 of the semiconductor laser must be close to the phase matching bandwidth of the wavelength conversion device. When the lasing wavelength does not correspond to the phase matching bandwidth of the wavelength conversion device, the intensity of the visible light beam 128 may be reduced. Accordingly, by modulating the lasing wavelength $\lambda_1$ of the semiconductor laser 110 while monitoring the output intensity of the wavelength conversion device 120 with the optical detector 170, a specific lasing wavelength $\lambda_1$ may be determined based on fluctuations in the output intensity of the wavelength conversion device such that the output intensity of the wavelength conversion device 120 is optimized. In one embodiment, the output intensity of the wavelength conversion device 120 may be optimized when the output intensity is at a maximum. In another embodiment, the output intensity of the wavelength conversion device 120 may be optimized when the output intensity reaches a predetermined value other than the maximum output intensity.

As noted hereinabove, the frequency of the modulated or dithered wavelength feedback control signal is selected to avoid interference with the encoded data signal or harmonics of the encoded data signal. Accordingly, in the embodiments described herein, the frequency of the modulated or dithered wavelength feedback control signal is:

$$v_\lambda = (N+1/P)v_{DATA}$$

where $v_\lambda$ is the frequency of the modulated wavelength feedback control signal, N is an integer and P is an integer greater than one. In embodiments where the optical package 200 is used to display video images, the integer N may be greater than zero so as to avoid interference with lower frequencies which may be present in the video signal. For example, in one embodiment, N may be 1 and P may be 2 such that the frequency $v_\lambda$ of the modulated wavelength feedback control signal is $1.5 * v_{DATA}$. In another embodiment, N may be 2 and P may be 2 such that the frequency $v_\lambda$ of the modulated wavelength feedback control signal is $2.5 * v_{DATA}$. This embodiment is graphically illustrated in FIG. 5 which shows the frequency content of a modulated feedback control signal having a frequency of $2.5 * v_{DATA}$.

As the wavelength selective section of the semiconductor laser 110 is supplied with a modulated wavelength feedback control signal, the package controller 150 may simultaneously provide the adjustable optical component of the adaptive optics with a modulated or dithered position feedback control signal to modulate or dither the position of the adjustable optical component in one direction and, therefore, modulate the position of the IR light beam 119 of the semiconductor laser on the input facet of the wavelength conversion device 120. As discussed hereinabove, the dimensions of the waveguide portion of the wavelength conversion device, and the mode field diameter of the wavelength conversion device, may be small, on the order of several microns. If the beam 119 of the semiconductor laser 110 is misaligned with the waveguide portion of the wavelength conversion device 120, the output intensity of the wavelength conversion device 120 may be less than when the output beam is precisely aligned with the waveguide portion.

Accordingly, by modulating the position of the adjustable optical component while measuring the output intensity of the wavelength conversion device, the output beam 119 of the semiconductor laser 110 may be scanned over the surface of the input facet of the wavelength conversion device 120 and any measured changes in the output intensity of the wavelength conversion device may be correlated to the position of the adjustable optical component as it is modulated. Using this technique, a position of the adjustable optical component may be determined such that the output of the wavelength device is optimized.

As described herein, modulating the adjustable optical component comprises moving the adjustable optical component in either a first direction or a second direction. For example, in one embodiment, when the adjustable optical component is an adjustable mirror, such as a MEMS or MOEMS mirror, as shown in FIG. 2, moving the adjustable optical component in a first direction comprises oscillating the optical component about a first axis, such as the x-axis. Similarly, moving the adjustable optical component in the second direction comprises oscillating the adjustable optical component about a second axis, such as the y-axis.

In another embodiment, when the adjustable optical component is an adjustable lens, the position of the lens may be moved in a first direction by oscillating the position of the lens along a first axis, such as the x-axis, while the position of the lens may be moved in a second direction by oscillating the position of the lens along a second axis, such as the y-axis.

As described hereinabove with respect to the modulated wavelength control signal, the modulated position feedback control signal has a frequency different than that of the encoded data signal of the data source 160. More specifically, the frequency $v_\theta$ of the modulated position feedback control signal is the same as the frequency $v_\lambda$ of the modulated wavelength feedback control signal. However, to facilitate differentiation of changes in the output intensity of the wavelength conversion device due to the modulated position feedback control signal from changes due to the modulated wavelength feedback control signal, the modulated position feedback control signal and the modulated wavelength feedback control signal may be made out of phase with one another. In one embodiment, the modulated feedback position control signal is 90 degrees out of phase with the modulated wavelength feedback control signal.

The modulated position feedback control signal facilitates modulating the position of the optical component in one direction (e.g., either a first direction or a second direction). However, to optimize the output of the wavelength conversion device, the adjustable optical component must be positioned in at least two directions (e.g., the x- and y-directions) in order to optimize the output of the wavelength conversion device.

Accordingly, in one embodiment, the package controller 150 may be programmed to periodically alternate between modulating the adjustable optical component in a first direction and modulating the adjustable optical component in a second direction. For example, for a given period of time, the modulated position feedback control signal may be applied by the package controller to rotate the adjustable mirror 144 shown in FIG. 2 about the x-axis such that the IR light beam 119 is scanned over the input facet of the wavelength conversion device in the y-direction. After the given time period has elapsed, the modulated position feedback control signal may be applied to rotate the adjustable mirror 144 shown in FIG. 2 about the y-axis such that the IR light beam 119 is scanned over the input facet of the wavelength conversion device in the x-direction. Therefore, by alternating between applying the modulated position feedback control signal to two different axes at a given modulation or dither frequency, the modulated position feedback control signal may be used to position the output beam 119 of the semiconductor laser along both axes thereby optimizing the output intensity of the wavelength conversion device 120 for both axes. Alternatively, in another embodiment, the package controller 150 may be programmed to periodically alternate between modulating the wavelength control signal and modulating the adjustable optical component in a second direction.

As the modulated wavelength feedback control signal is applied to the semiconductor laser 110 and the modulated position feedback control signal is applied to the adjustable optical component of the adaptive optics 140, the output intensity of the wavelength conversion device 120 may be measured with the optical detector 170. The optical detector 170 provides the package controller 150 with an electrical signal which is indicative of the output intensity and the changes in the output intensity of the wavelength conversion device. Accordingly, it should now be understood that the changes in the output intensity of the wavelength conversion device may be attributed to both the modulated position feedback control signal and the modulated wavelength feedback control signal.

The package controller 150 may be operable to analyze the measured output intensity of the wavelength conversion device to identify and isolate spectral components (e.g., changes in the output intensity due to the modulated wavelength feedback control signal) and positional components (e.g., changes in the output intensity due to the time shifted application of the modulated position feedback control signal) of the measured output intensity of the wavelength conversion device 120. Based on the identified spectral and positional components of the measured output intensity, the package controller may also determine the required change in the wavelength control signal and the positional control signals such that the output of the wavelength conversion device is optimized. Methods for analyzing the measured output intensity of the wavelength conversion device 120 to isolate the spectral and positional components and to determine the required change in the control signals will now be describe in more detail.

In one embodiment, where two modulation or dither signals (e.g., a modulated wavelength feedback control signal and modulated position control signal) which are 90 degrees out of phase, the combined modulation signal C(t) may be written as:

$$C(t)=\epsilon_\theta \cdot \cos(\omega t)+\epsilon_\lambda \cdot \sin(\omega t),$$

where the cosine term is the modulated position feedback control signal, the sine term is the modulated wavelength control signal and $\epsilon_\theta$ and $\epsilon_\lambda$ are the amplitudes of the modulated position feedback control signal and the modulated wavelength control signal, respectively. C(t) may be rewritten as $$C(t)=M \cdot \sin(\omega t+\alpha)$$

where $\omega=2\pi v_\theta=2\pi v_\lambda$ and t is a period of modulation. M and $\alpha$ are functions of $\epsilon_\theta$ and $\epsilon_\lambda$ and may be written as:

$$M = \sqrt{(\varepsilon_\theta)^2 + (\varepsilon_\lambda)^2} \text{ and } \alpha = \arctan(\varepsilon_\theta/\varepsilon_\lambda).$$

The encoded data signal DATA(t) provided by the data source, including any higher order harmonics of the encoded data signal, may be represented as a Fourier series such that:

$$\text{DATA}(t)=A_0+A_1 \cdot \cos(2\pi v_{DATA} \cdot t)+B_1 \sin(2\pi v_{DATA} \cdot t)+$$
$$A_2 \cdot \cos(2\pi v_{DATA} \cdot t)+B_2 \sin(2\pi v_{DATA} \cdot t)+\ldots$$

Accordingly, the modulated measured output intensity $S_{out}(t)$ of the wavelength conversion device may be expressed as the sum of the combined modulation signal C(t) and the encoded data signal DATA(t) such that:

$$S_{out}(t)=C(t)+\text{DATA}(t)=[M \cdot \sin(\omega t+\alpha)+\text{DATA}(t)]$$

In order to isolate the position and wavelength modulation feedback control signals from the measured output intensity, the package controller 150 may be programmed to multiply the measured modulated output intensity (e.g., $S_{out}(t)$) by one of sin($\omega$t) or cos($\omega$t) and integrate the product over T periods of modulation where T=P/$v_{DATA}$. This operation eliminates the modulation inherent in the measured modulated output intensity due to the modulation of the encoded data signal at a frequency $v_{DATA}$. Depending on which multiplier is used (e.g., sin($\omega$t) or cos($\omega$t)), one of the spectral component of the measured output intensity or the positional component of the measured output intensity will be eliminated through the multiplication/integration step. The results of the integration will be proportional to the change which must be applied to the respective control signal to optimize the output intensity of the wavelength conversion device for that particular control signal. More specifically, the sign and magnitude of the result of the integration will indicate the direction and amount by which the control signal must be adjusted to optimize the output of the wavelength conversion device.

For example, when the modulated wavelength control signal is a cosine function and the modulated position feedback control signal is a sine function, as shown above, the following scheme may be applied to isolate the spectral and positional components of the measured output intensity of the wavelength conversion device. To isolate the spectral component (e.g., to eliminate the positional component) the modulated measured output intensity $S_{out}(t)$ is multiplied by sin($\omega$t) and integrated over T periods of the encoded data signal such that:

$$\int_0^T [M \cdot \sin(\omega t + \alpha) + \text{DATA}(t)](\sin \omega t)\, dt$$

where T=P/$v_{DATA}$. Since the modulation frequency of the wavelength control feedback signal and the position control feedback signal (e.g., $\omega=2\pi v_\theta=2\pi v_\lambda$) to the frequency of the encoded data signal (e.g., $2\pi v_{DATA}$), or multiples thereof, the integration yields the following:

$$\int_0^T [M \cdot \sin(\omega t + \alpha) + \text{DATA}(t)](\sin\omega t)\,dt = M\frac{T}{2}\cos(\alpha).$$

When the modulated wavelength feedback control signal is a sine function, the result of the integrand is proportional to the magnitude and direction by which the wavelength control signal to the wavelength selective section of the semiconductor laser 110 should be adjusted to optimize the output of the wavelength conversion device.

Similarly, to isolate the positional component (e.g., to eliminate the spectral component) the measured modulated output intensity may be multiplied by $\cos(\omega t)$ and integrated over T periods such that:

$$\int_0^T [M \cdot \sin(\omega t + \alpha) + \text{DATA}(t)] \cdot (\cos\omega t)\,dt = M \cdot \frac{T}{2} \cdot \sin(\alpha)$$

When the modulated position control signal is a cosine function, as described above, the result of the integration yields the magnitude and direction by which the wavelength control signal to the adjustable optical component should be adjusted to optimize the output of the wavelength conversion device.

While the example calculation shown and described herein is for the situation where the modulated wavelength control signal is a sine function and the modulated position feedback control signal is a cosine function, it should be understood that similar operations may be performed when the modulated wavelength control signal is a cosine function and the modulated position feedback control signal is a sine function. However, in those circumstances, different multipliers may be used. More specifically, to isolate a spectral or positional component based on a control signal having a sine modulation, the measured output intensity should be multiplied by $\sin(\omega t)$ and then integrated while, to isolate a spectral or positional component based on a control signal having a cosine modulation, the measured output intensity should be multiplied by $\cos(\omega t)$ and then integrated.

Further, it should be understood that the isolated positional component may be indicative of the adjustment that should be made to the adjustable optical component on one of two axes at any given time. Accordingly, the package controller may be operable to correlate the magnitude and direction of the adjustment to the axis of the adjustable component that was being modulated when the measurement of the output intensity of the wavelength conversion device was made.

After the package controller has identified and isolated the spectral and positional component of the measured output intensity that are attributable to the modulated wavelength control signal and the modulated position feedback control signal, the package controller adjusts the wavelength control signal applied to the wavelength selective section of the laser based on the isolated spectral component of the measured output intensity such that the output intensity of the wavelength conversion device is optimized. The package controller also adjusts the position control signals applied to the adjustable optical component based on the isolated positional component of the measured output intensity such that the measured output intensity of the wavelength conversion device is optimized.

Changes in the output intensity of the wavelength conversion device due to the application of the modulated feedback control signals are a fraction of the average output intensity of the wavelength conversion device. Accordingly, the magnitude of the adjustment integral will depend on the average output intensity of the wavelength conversion device. Similarly, the convergence speed is also dependent on the output intensity. However, it is desirable to have the same convergence speed regardless of the output intensity of the wavelength conversion device. As such, in one embodiment, the result of the adjustment integral may be normalized by dividing the integrand by the average output intensity of the wavelength conversion device over the period of integration.

In another embodiment of the multi-variable control method described herein, the package controller modulates both the x- and y-position control signals simultaneously (as opposed to simultaneously modulating the wavelength control signal and the position control signal). In this embodiment, the package controller 150 supplies the adjustable optical component with a first modulated feedback position control signal to modulate the position of the adjustable optical component on a first axis and thereby modulate the position of the output beam on the input facet of the wavelength conversion device in a first direction. To avoid interference with the encoded data signal, the first modulated feedback position control signal has a frequency $v_{\theta 1}$ such that $$v_{\theta 1} = (N+1/P)v_{DATA}$$

where $v_{\theta 1}$ is the frequency of the first modulated wavelength feedback control signal, N is an integer and P is an integer greater than 1. In one embodiment, where the encoded data signal is a video signal, the integer N may be greater than zero to avoid interference with the low frequency components of the video signal.

Simultaneously, the package controller 150 supplies the adjustable optical component with a second modulated feedback position control signal to modulate the position of the adjustable optical component on a second axis and thereby modulate the position of the output beam on the input facet of the wavelength conversion device in a second direction. To avoid interference with the encoded data signal, the second modulated position feedback control signal has frequency $v_{\theta 2}$ which is the same as the frequency $v\theta 1$ of the first modulated position feedback control signal. However, to facilitate differentiation of changes in the output intensity due to the first modulated position feedback control signal and the second modulated position feedback control signal, the two signals are phase shifted such that the first modulated position feedback control signal and the second modulated position feedback control signal are out of phase with one another. In one embodiment, the two signals are 90 degrees out of phase with one another.

As described hereinabove, the output intensity of the wavelength conversion device may be measured with the optical detector 170 as the first modulated position feedback control signal and the second modulated position feedback control signals are applied to the adjustable optical component which, in turn, sends an electrical signal to the package controller 150 indicative of the changes in the output intensity of the wavelength conversion device. Thereafter, the controller analyzes the measured output intensity and determines first and second positional components of the measured output intensity which are attributable to each of the first modulated position feedback control signal and the second modulated position feedback control signal, respectively, using the multiplication/integration techniques described above. Specifically, to isolate the first positional and second positional components from the measured output intensity of the wavelength conversion device 120, the measured output intensity is multiplied by sin(ωt) or cos(ωt) where ω=2πv$_{θ1}$=2πv$_{θ2}$. Multiplying by sin(ωt) will eliminate one of the first positional component or the second positional component while multiplying by cos (ωt) will eliminate the other. The product is then integrated over T periods where T=P/v$_{DATA}$ and P is an integer as defined herein. The result of the integration yields the magnitude and direction of change which should be applied to the position control signal of the respective component (e.g. the first positional or second positional component) to optimize the output of the wavelength conversion device.

Based on the first and second positional components, the package controller adjusts the first position control signal and the second position control signal supplied to the adjustable optical components such that the output of the wavelength conversion device is optimized.

In one embodiment, as the adjustable optical component is modulated with the first modulated position feedback control signal and the second modulated position feedback control signal, a modulated wavelength feedback control signal is supplied to the wavelength selective section to modulate the lasing wavelength 21 of the semiconductor laser. In this embodiment, the modulated wavelength feedback control signal may have a frequency such that $$v_\lambda = (K+1/L)v_{DATA}$$

where v$_\lambda$ is the frequency of the modulated wavelength feedback control signal, K and L are integers greater than one and the modulation frequencies are selected such that v$_\lambda$ and v$_θ$ and are sufficiently different to permit resolution of the portion of the measured modulated output signal which is attributable to each. In one embodiment, where the encoded digital signal is a video signal, the integer K may be greater than zero to avoid interference with low frequency components of the video signal.

Spectral components of the measured output intensity of the wavelength conversion device 120 attributable to the modulated wavelength feedback control signal may be isolated using techniques similar to those described hereinabove. More specifically, the output intensity of the wavelength conversion device 120 may be multiplied by one of sin(ωt) (when the modulated wavelength feedback control signal is a sine function) or cos(ωt) (when the modulated wavelength feedback control signal is a cosine function) where ω=2πv$_\lambda$ and t is a period of modulation. Thereafter, the spectral component of the measured output intensity is integrated over an integer multiple of all three modulations periods (e.g., 1/v$_{DATA}$, 1/v$_\lambda$, 1/v$_{θ1}$) thereby eliminating unwanted frequencies and preserving an error signal proportional to the signal change caused by the modulation of the wavelength control signal. For example, if the modulation periods are 18 ms, 1 ms, and 10 ms, a suitable integration period would be 180 ms. The sign and magnitude of the integration are indicative of a direction and amount of change which should be applied to the wavelength control signal such that the output of the wavelength conversion device is optimized. The package controller utilizes the results of the integration to adjust the wavelength control signal supplied to the wavelength selective section of the semiconductor laser.

In another embodiment, the gain current supplied to the gain section of the semiconductor laser may be constantly adjusted to achieve a target output intensity from the wavelength conversion device. Such a control routine is called automatic power control (APC). When APC control routines are used, any change in the optical alignment of the semiconductor laser with the wavelength conversion device or a change in the wavelength of the semiconductor laser may not produce an appreciable change in the output intensity of the wavelength conversion device. Instead, the changes in the alignment and/or the wavelength of the semiconductor laser may cause a corresponding change in the gain current applied to the gain section of the semiconductor laser. For example, in one embodiment, the package controller may include circuitry to measure and adjust the gain current supplied to the gain section of the semiconductor laser. As described herein above, modulated wavelength feedback control signals and modulated position control signals may be supplied to the semiconductor laser and the adaptive optics while the change in gain current is monitored as a function of changes in the optical alignment of the semiconductor laser and/or the wavelength of the semiconductor laser. Based on the changes measured changes in the gain current, the control algorithms discussed herein may be to determine the changes in the gain current attributable due to the modulated wavelength feedback control signal and the modulated position control signals. Thereafter, the package controller may adjust the wavelength control signal supplied to the semiconductor laser and the position control signal supplied to the adaptive optics to optimize the gain current and, more specifically, to minimize the gain current supplied to the gain section of the semiconductor laser.

Accordingly, it should now be understood that the control methods described herein may be used to adjust an operating parameter of the optical package (e.g., the wavelength control signal or the alignment of the adaptive optics) by modulating the wavelength control signal and/or the position control signal(s) while measuring a response parameter (e.g., the gain current supplied to the gain section of the semiconductor laser or the output intensity of the wavelength conversion device) and thereby adjust the operating parameters such that the response parameter is optimized.

It should now be understood that the methods described herein facilitate multi-variable control of an optical package using control signals applied to various components of the optical package at a single frequency.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For the purposes of defining and describing the present invention, it is noted that reference herein to values that are "on the order of" a specified magnitude should be taken to encompass any value that does not vary from the specified magnitude by one or more orders of magnitude. It is also noted that one or more of the following claims recites a controller "programmed to" execute one or more recited acts. For the purposes of defining the present invention, it is noted that this phrase is introduced in the claims as an open-ended transitional phrase and should be interpreted in like manner as the more commonly used open-ended preamble term "comprising." In addition, it is noted that recitations herein of a component of the present invention, such as a controller being "programmed" to embody a particular property, function in a particular manner, etc., are structural recitations, as opposed to recitations of intended use. More specifically, the references herein to the manner in which a component is "programmed" denotes an existing physical condition of the component and, as such, is to be taken as a definite recitation of the structural characteristics of the component.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed is:

1. A method for controlling an optical package comprising a semiconductor laser, a wavelength conversion device, adaptive optics configured to optically couple an output beam of the semiconductor laser into a waveguide portion of an input facet of the wavelength conversion device, an optical detector, and a package controller programmed to operate the semiconductor laser and at least one adjustable optical component of the adaptive optics, the method comprising:

controlling the periodic lasing intensity of the semiconductor laser by controlling an amount of gain current $I_{GAIN}$ injected into a gain section of the semiconductor laser, wherein the gain current $I_{GAIN}$ has a periodic frequency $v_{DATA}$;

supplying a wavelength control signal to a wavelength selective section of the semiconductor laser to control a lasing wavelength $\lambda_1$ of the semiconductor laser;

positioning the output beam on the input facet of the wavelength conversion device by supplying a position control signal to the adjustable optical component;

supplying a modulated wavelength feedback control signal to the wavelength selective section to modulate the lasing wavelength $\lambda_1$ of the semiconductor laser by wherein:

$v_\lambda = (N+1/P)v_{DATA}$ where $v_\lambda$ is the frequency of the modulated wavelength feedback control signal, N is an integer and P is an integer greater than one;

supplying a modulated position feedback control signal to the adjustable optical component to modulate the position of the output beam on the input facet of the wavelength conversion device, wherein the modulated position feedback control signal is out of phase with the modulated wavelength feedback control signal and a frequency $v_\theta$ of the modulated position feedback control signal is the same as the frequency $v_\lambda$ of the modulated wavelength feedback control signal;

measuring a response parameter of the wavelength conversion device;

analyzing the measured response parameter of the wavelength conversion device to identify spectral and positional components attributable to the modulated wavelength feedback control signal and modulated position control signal;

adjusting the wavelength control signal based on the spectral component of the measured response parameter to optimize the response parameter of the wavelength conversion device; and adjusting the position control signal based on the positional component attributable to the modulated position control signal to optimize the response parameter of the wavelength conversion device.

2. The method of claim 1 wherein the response parameter is the output intensity of the wavelength conversion device.

3. The method of claim 1 wherein the response parameter is the gain current $I_{GAIN}$ injected into the gain section of the semiconductor laser.

4. The method of claim 1 wherein the wavelength control signal controls a temperature $T_\lambda$ of the wavelength selective section, an amount of current $I_\lambda$ injected into the wavelength selective section, or both.

5. The method of claim 1 wherein the adjustable optical component is adjustable in a first direction and a second direction.

6. The method of claim 5 wherein the modulated position feedback control signal is periodically alternated between oscillating the adjustable optical component in the first direction and oscillating the adjustable optical component in the second direction.

7. The method of claim 1 wherein the modulated position feedback control signal and the modulated wavelength feedback control signal are out of phase by 90 degrees.

8. The method of claim 1 wherein the spectral component and the positional component are isolated by multiplying the measured response parameter by one of $\sin(\omega t)$ or $\cos(\omega t)$, where $\omega = 2\pi v_\theta = 2\pi v_\lambda$ and t is a period of modulation, and integrating the product over T periods of modulation, wherein the result of the integrand is proportional to a direction and magnitude of the adjustment to the wavelength control signal or the position control signal.

9. The method of claim 1 wherein:
the adjustable optical component of the adaptive optics is an adjustable mirror; and
the adaptive optics, the wavelength conversion device, and the semiconductor laser are positioned to define a folded optical pathway between an output of the semiconductor laser and an input of the wavelength conversion device.

10. The method of claim 9 wherein the adjustable optical component comprises a MEMS mirror.

11. A method of controlling an optical package comprising a semiconductor laser, a wavelength conversion device, adaptive optics configured to optically couple an output beam of the semiconductor laser into a waveguide portion of an input facet of the wavelength conversion device, an optical detector, and a package controller programmed to operate the semiconductor laser and at least one adjustable optical component of the adaptive optics, the method comprising:

controlling the periodic lasing intensity of the semiconductor laser by controlling an amount of gain current $I_{GAIN}$ injected into a gain section of the semiconductor laser, wherein the gain current $I_{GAIN}$ has a periodic frequency $v_{DATA}$;

supplying a first position control signal to the adjustable optical component to control the position of the output beam on the input facet of the wavelength conversion device in a first direction;

supplying a second position control signal to the adjustable optical component to control the position of the output beam on the input facet of the wavelength conversion device in a second direction;

supplying a first modulated position feedback control signal to the adjustable optical component to modulate the position of the output beam on the input facet of the wavelength conversion device in the first direction, wherein:

$$v_{\theta 1} = (N + 1/P) v_{DATA}$$

where $v_{\theta 1}$ is the frequency of the first modulated wavelength feedback control signal, N is an integer and P is an integer greater than 1;

supplying a second modulated position feedback control signal to the adjustable optical component to modulate the position of the output beam on the input facet of the wavelength conversion device in the second direction, wherein the second modulated position feedback control signal is out of phase with the first modulated position feedback control signal and a frequency $v_{\theta 1}$ of the modulated position feedback control signal is the same as the frequency $v_{\theta 2}$ of the modulated wavelength feedback control signal;

measuring a response parameter of the wavelength conversion device;

analyzing the measured response parameter of the wavelength conversion device to identify positional components attributable to the first modulated position feedback control signal and the second modulated position feedback control signal;

adjusting the first position control signal based on the positional component attributable to the first modulated position feedback control signal to optimize the response parameter of the wavelength conversion device; and adjusting the second position control signal based on the positional component attributable to the second modulated position feedback control signal to optimize the response parameter of the wavelength conversion device.

12. The method of claim 11 wherein the response parameter is the output intensity of the wavelength conversion device.

13. The method of claim 11 wherein the response parameter is the gain current $I_{GAIN}$ injected into the gain section of the semiconductor laser.

14. The method of claim 11 further comprising:
supplying a wavelength control signal to a wavelength selective section of the semiconductor laser to control the lasing wavelength $\lambda_1$ of the semiconductor laser;
supplying a modulated wavelength feedback control signal to the wavelength selective section to modulate the lasing wavelength $\lambda_1$ of the semiconductor laser, wherein:

$$v_\lambda = (K + 1/L) v_{DATA}$$

where $v_\lambda$ is the frequency of the modulated wavelength feedback control signal, K is an integer and K is not equal to N and L is an integer greater than one;

analyzing the measured response parameter of the wavelength conversion device to identify a spectral component attributable to the modulated wavelength feedback control signal and modulated position control signal; and adjusting the wavelength control signal based on the spectral component of the measured response parameter to optimize the response parameter of the wavelength conversion device.

15. The method of claim 11 wherein the wavelength control signal controls a temperature $T_\lambda$ of the wavelength selective section, an amount of current $I_\lambda$ injected into the wavelength selective section, or both.

16. The method of claim 11 wherein the first modulated position feedback control signal and the second modulated position feedback control signal are out of phase by 90 degrees.

17. The method of claim 16 wherein the positional components are isolated by multiplying the measured response parameter by one of $\sin(\omega t)$ or $\cos(\omega t)$, where $\omega = 2\pi v_{\theta 1} = 2\pi v_{\theta 2}$ and t is a period of modulation, and integrating the product over T periods of modulation, wherein the result of the integrand is proportional to a direction and magnitude of the adjustment to the first position control signal or the second position control signal.

18. The method of claim 14 wherein the spectral components are isolated by $\sin(\omega t)$ or $\cos(\omega t)$, where $\omega = 2\pi v_\lambda$ and t is a period of modulation, and integrating the product over an integer multiple of $1/v_{DATA}$, $1/v_\lambda$ and $1/v_{\theta 1}$.

19. The method of claim 11 wherein:
the adjustable optical component of the adaptive optics is an adjustable mirror; and
the adaptive optics, the wavelength conversion device, and the semiconductor laser are positioned to define a folded optical pathway between an output of the semiconductor laser and an input of the wavelength conversion device.

20. The method of claim 11 wherein the adjustable optical component is a MEMS mirror.

* * * * *